US006197132B1

(12) United States Patent
Andersson-Drugge

(10) Patent No.: US 6,197,132 B1
(45) Date of Patent: Mar. 6, 2001

(54) METHOD OF MANUFACTURING FERRITIC STAINLESS FECRA1-STEEL STRIPS

(75) Inventor: Ing-Marie Andersson-Drugge, Hofors (SE)

(73) Assignee: Sandvik AB, Sandviken (SE)

( * ) Notice: Subject to any disclaimer, the term of this patent is extended or adjusted under 35 U.S.C. 154(b) by 0 days.

(21) Appl. No.: 09/242,535

(22) PCT Filed: Aug. 26, 1997

(86) PCT No.: PCT/SE97/01416

§ 371 Date: Oct. 20, 1999

§ 102(e) Date: Oct. 20, 1999

(87) PCT Pub. No.: WO98/08986

PCT Pub. Date: Mar. 5, 1998

(30) Foreign Application Priority Data

Aug. 30, 1996 (SE) .................................................. 9603152

(51) Int. Cl.[7] ......................................................... C21D 6/00
(52) U.S. Cl. ............................ 148/524; 148/531; 148/535
(58) Field of Search ............................... 148/524, 531, 148/535

(56) References Cited

U.S. PATENT DOCUMENTS

| 3,394,659 | 7/1968 | Van Alen | 417/373 |
|---|---|---|---|
| 3,631,698 | * 1/1972 | Seulen et al. | 72/56 |
| 3,804,679 | * 4/1974 | Streel | 148/531 |
| 3,907,611 | 9/1975 | Sasame et al. | 428/629 |
| 4,079,157 | 3/1978 | Yagi et al. | 428/653 |
| 4,504,324 | * 3/1985 | Furuno | 148/265 |
| 5,366,139 | 11/1994 | Jha et al. | 228/193 |
| 5,447,698 | 9/1995 | Jha et al. | 422/180 |
| 5,547,769 | * 8/1996 | Schmitz | 148/531 |
| 5,603,754 | * 2/1997 | Aoki et al. | 106/14.12 |

FOREIGN PATENT DOCUMENTS

| 655267 | * 4/1986 | (CH) | 148/531 |
|---|---|---|---|
| 2-57673 | * 2/1990 | (JP) | 148/531 |
| WO 96/05284 | 2/1996 | (WO) . | |
| 96/15284 | * 5/1996 | (WO) . | |

* cited by examiner

*Primary Examiner*—George Wyszomierski
(74) *Attorney, Agent, or Firm*—Burns, Doane, Swecker & Mathis, L.L.P.

(57) ABSTRACT

The invention provides a method for the continuous manufacture of ferritic stainless steel bands suitable for use in environments with frequent changes in temperature. It has been found preferable to have such band longitudinally displaced through a coating chamber wherein the band is provided with a coating of aluminum that is deposited thereon by means of physical vapor deposition technology during a time period sufficient so that aluminum becomes evenly distributed in the ferrite, after which a homogenization occurs at 950–1150° C.

9 Claims, 4 Drawing Sheets

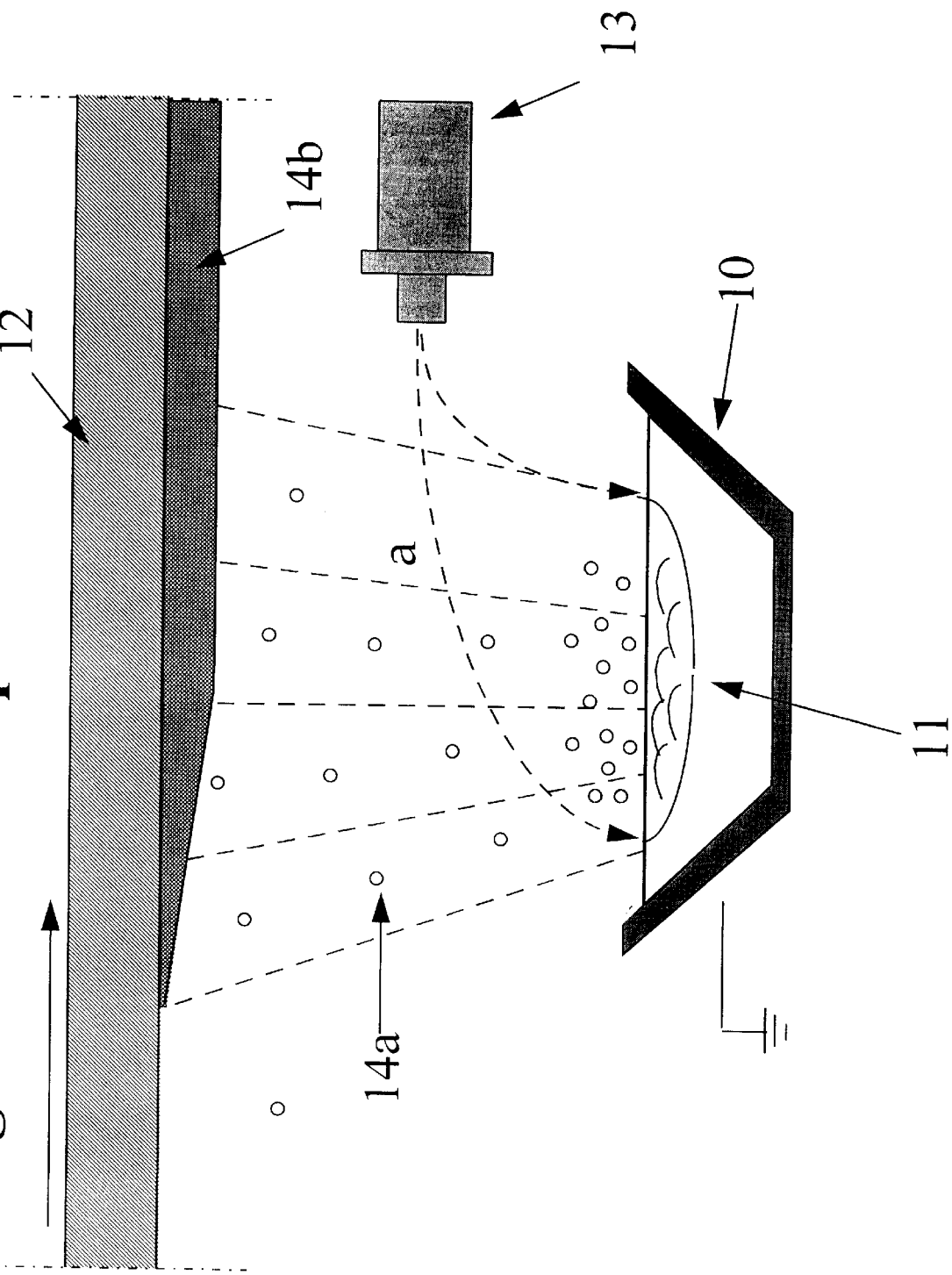
Figure 1: PVD-deposition

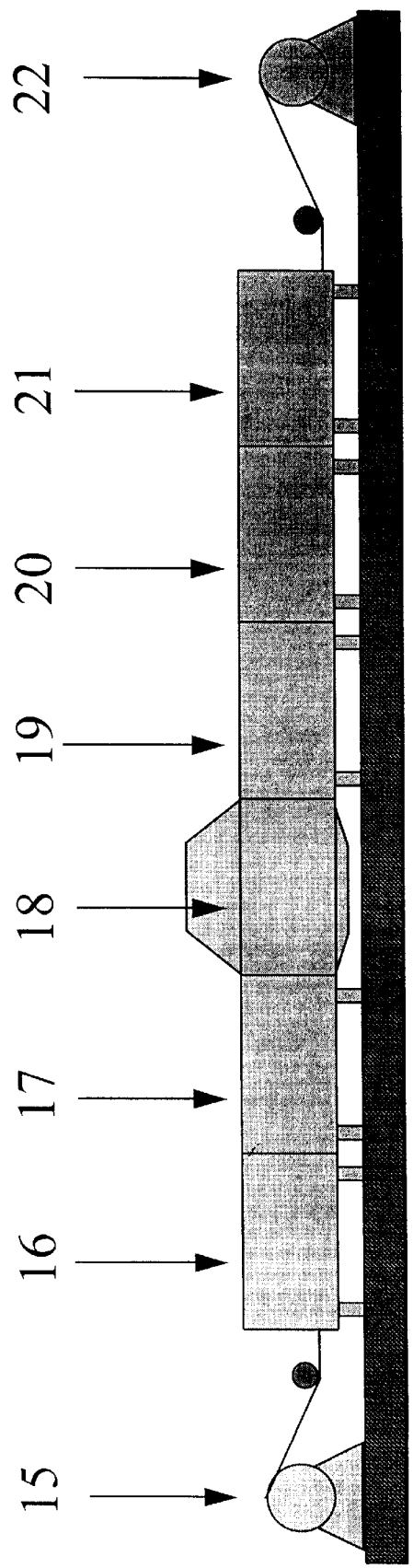

Figure 3: Alternative 1
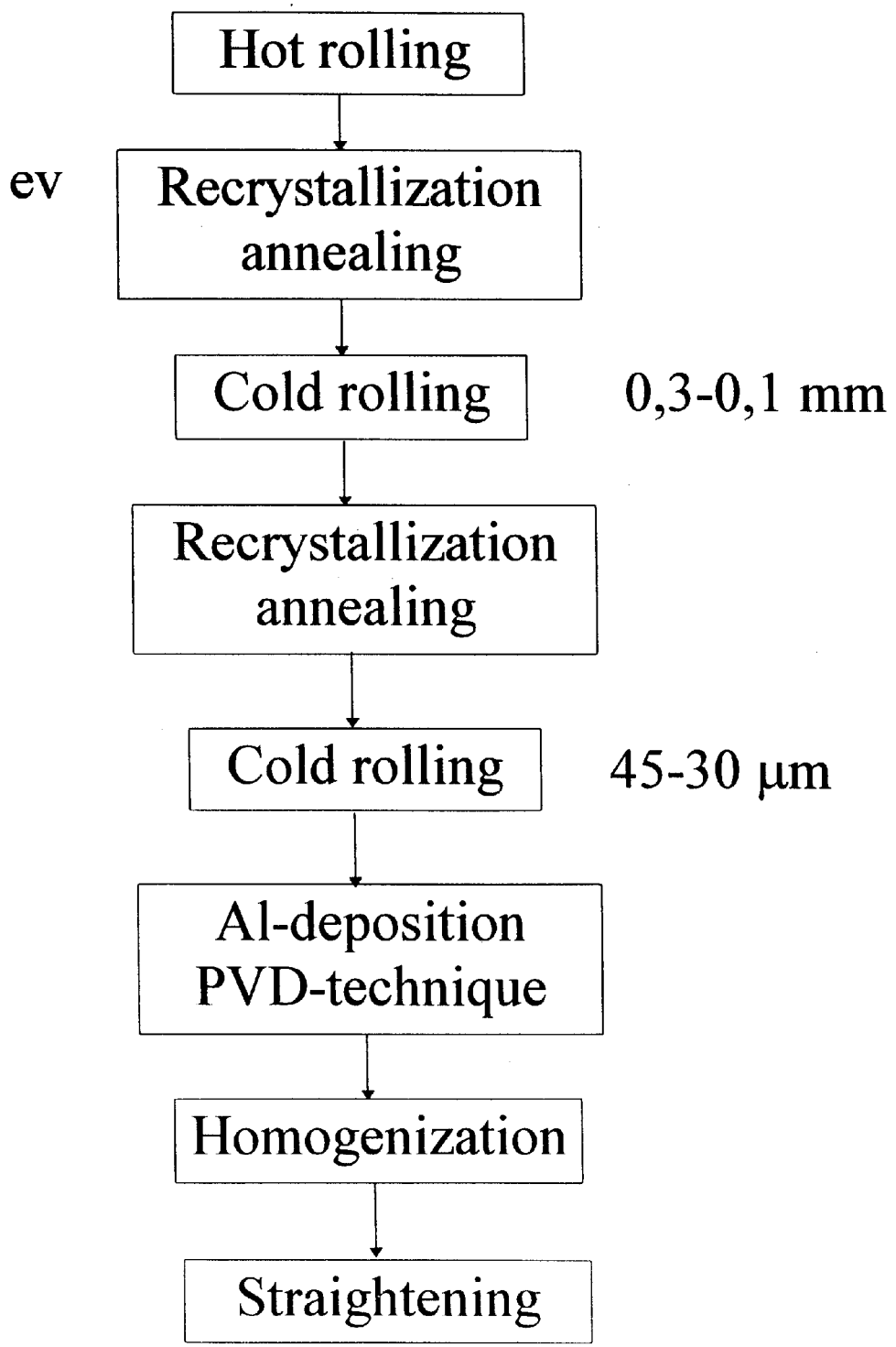

Figure 4: Alternative 2
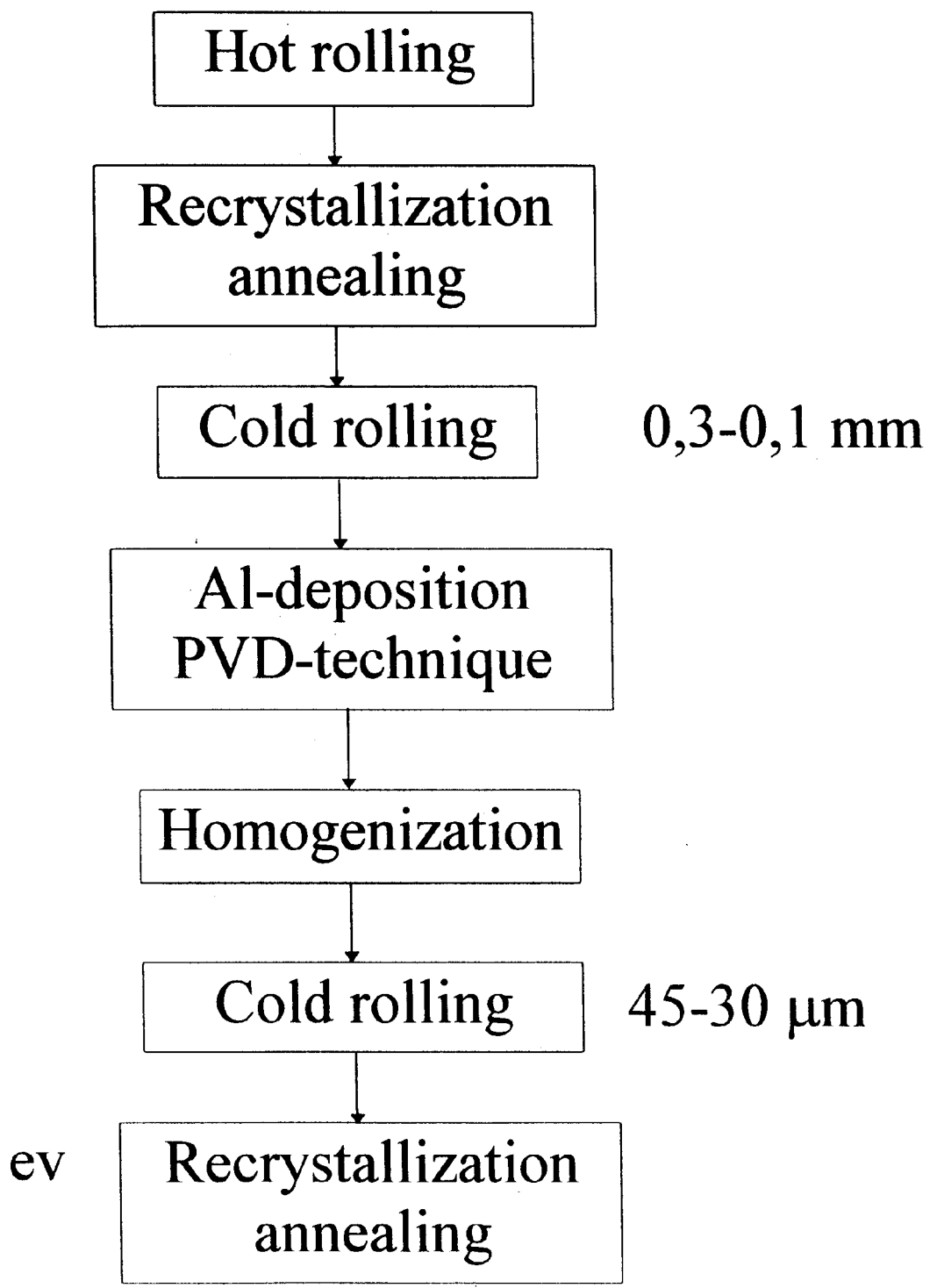

METHOD OF MANUFACTURING FERRITIC STAINLESS FECRAl-STEEL STRIPS

BACKGROUND OF THE INVENTION

The present invention relates to a new method of making high temperature resistant FeCrAl-steel strip from ferritic (FeCr) stainless steel by using physical deposition technology which usually is called "physical vapor deposition" (PVD)-technique. Steel strips rich in aluminum are used in applications where there is high temperatures as well as a quick change in temperature. One example is thin foils for metallic catalytic converters where aluminum is used to form oxides that protect the steel surface from corrosive attacks. One great advantage of the invention is the increased flexibility in varying the analysis of said steel, primarily in regard to the aluminum content.

It is prior art to use FeCrAl-alloys for heat resistant applications such as purification of automobile gases by using metallic catalytic converters. Aluminum is added to the steel to form aluminum oxide which is one of the most stable oxides having a low speed of oxygen diffusion. Therefore, the aluminum oxide provides a good protection against corrosion at high temperatures in an oxidation atmosphere. Those alloys are difficult to manufacture by conventional steel-making from scrap-based metallurgy via casting, hot rolling and cold rolling. Inevitably both macroscopic and microscopic inclusions will be formed, mainly aluminum-based which will complicate their manufacture and contribute to less efficiency primarily when cold rolling the material down to its final dimension. Intermetallic phases will be formed at 450–500° C. and those precipitations will reduce the toughness of the material and make the steel brittle. This means that the heat treatment steps involved in the manufacture must be carried out very carefully, i.e., the material must be quenched below that area where intermetallic phases are being formed. It is established that conventional manufacturing technology puts a limitation to the aluminum content at maximum of 6% in order to minimize such process problems.

There are other methods available for the making of this type of material. One method includes rolling a ferritic stainless steel jointly with an aluminum foil (U.S. Pat. Nos. 5,366,139 and 5,447,699). A ferritic chromium steel is rolled to suitable band thickness after which said band is rolled jointly with a surrounding aluminum foil to a final thickness. Such cold rolled composite material consists of three layer that is heat treated to obtain a homogenous material with aluminum evenly distributed in the ferritic matrix.

Another variant includes dipping the steel band into a bath of liquid aluminum or an aluminum alloy (U.S. Pat. Nos. 3,907,611, 3,394,659 and 4,079,157). This method, however, is complex and it is difficult to control the process parameters. This causes large manufacturing costs which are not commercially feasible.

OBJECTS AND SUMMARY OF THE INVENTION

It is an object of this invention to avoid or alleviate the prior art.

It is a primary object of the invention to provide a new method for the manufacture of high temperature resistant FeCrAl-bands which is not connected with same limitations in regard of Al-content as associated with conventional methods.

It is another object to provide a method that enables continuous production "on-line" at very moderate cost levels.

It is an aspect of the invention to provide a method of manufacturing high-temperature resistant ferritic Cr-steel bands, including fabricating a FeCr-steel with rare earth metal additives, rolling said steel into a band in several steps with intermediate recrystallization anneals between said rolling steps, feeding the band into a coating chamber in which aluminum is deposited by physical vapor deposition technique during a time period sufficient to have Al evenly distributed in the ferrite, and heat treating said band at a temperature of 950–1150° C. for a time sufficient to obtain homogenization and diffusion of the aluminum into said steel band.

BRIEF DESCRIPTION OF THE DRAWINGS

The invention will now be described by reference to some examples by referring to the attached drawings, in which FIG. 1 is a principal sketch of the physical deposition method for applying aluminum.

FIG. 2 is an example of a continuous manufacture line for making FeCrAl-bands.

FIG. 3 is a flow chart of the manufacture according to one embodiment of the invention, and FIG. 4 is a flow chart of another alternative manufacturing sequence in accordance with the invention.

DETAILED DESCRIPTION OF THE PREFERRED EMBODIMENTS OF THE INVENTION

According to the invention, the raw material shall be a ferritic stainless chromium steel with suitable additive components so as to increase high-temperature strength of such material, including rare earth metals such as cerium, lanthanum or yttrium, which material shall be manufactured by scrap-based metallurgy and subjected to hot rolling down to smallest possible strip thickness. The material is then subjected to cold rolling to a suitable dimension after which the material is subject to aluminum deposition by Physical Vapor Deposition (PVD)-technology. The steel strip could be coated with aluminum after rolling to final dimension, or coated at an intermediate dimension after which such Al-coated strip becomes subject of further working to its final cold rolled thickness. In order to ensure that a fully homogenous strip with aluminum evenly distributed in the ferrite is obtained, it is necessary to make said strip subject to heat treatment at about 950° C. up to about 1150° C. during a suitable time period.

Aluminum will be diffused into the ferritic steel, and the time period required for this even distribution depends on those time-temperature conditions that are selected and the thickness of said ferritic Cr-steel. In accordance with one process embodiment, the heat treatment is made "on-line" in association with the PVD-equipment before the strips are coiled. As a result of such fabrication, a homogenous steel strip containing 70–75 wt-% Fe, 15–25 wt-% Cr and 5–10 wt-% Al can be made thanks to this sequence of process steps.

Many various PVD-methods are known for the use of different types of vapor deposition sources that enable the decomposition of aluminum into atoms. Thermal vaporization or evaporation are very suitable technologies for depositing aluminum. As exemplary methods can be mentioned heating by resistivity, by electron-beam, by induction, by arc resistance or by laser. Evaporation by electron-beam is a relatively simple and cheap method and can to advantage be used for the deposition of aluminum.

FIG. 1 shows schematically an equipment that includes a water-cooled copper ladle 10 in which a smelt of aluminum 11 is contained and kept at sufficient temperature. A steel band 12 of ferritic Cr-steel is longitudinally displaced above said ladle. An electron gun 13 is located on a suitable distance above the ladle 10 so as to ensure that a sufficient plasma 14a of aluminum is obtained so as to form a coating 14b on the band 12.

The equipment shown in FIG. 2 for continuous fabrication of FeCrAl-bands includes a coil 15 from which the band 12 is fed into a washing device 16 in which the band is clean-washed. The band 12 is then displaced into a sluice 17 from which the band is then displaced into a coating chamber 18 containing the equipment shown in FIG. 1. After the band has been provided with a layer of aluminum in said chamber 18 said band is displaced into a chamber 19 for heat treatment, followed by a band cooler 20 and finally a sluice 21. After leaving this equipment the band is displaced on to a coiler 22.

The invention is additionally illustrated in connection with the following Examples which are to be considered as illustrative of the present invention. It should be understood, however, that the invention is not limited to the specific details of the

EXAMPLE 1

A preferred process embodiment of the invention will now be described more in detail in connection with the process flow chart as shown in FIG. 3.

Firstly, a warm band 12 of a ferritic stainless Cr-steel and with rare earth additives with a thickness of 2–2.8 mm is fabricated. The band 12 is cold rolled in several steps with a certain number of recrystallization steps between said rolling steps until a cold rolled band thickness of 30–45 $\mu$m is obtained. The first step inside the PVD-installation for Al-deposition includes washing the material in a container 16 in which de-ionized water is provided. In order to obtain 5–10 weight-% of Al, both sides of the band are coated with a layer with 3–10 $\mu$m thickness of pure aluminum in the coating chamber 18. The band is subjected to heat treatment at 950–1150° C. in the chamber 19 during a time period from 20 seconds up to several minutes depending upon the type of heating that is used. The heat treatment can be carried out in the same line or as subsequent steps in a continuous conveyor furnace or in a bell-type furnace. The heat treatment can also be carried out in connection with the fabrication of the catalytic converter. If the heat treatment occurs in same line as the PVD-coating step, a quick heating can to advantage be carried out, for instance by induction heating or direct heating via rolls. Shape problems after annealing in the PVD-line can be avoided by subjecting the material to hot straightening after heat treatment. The band will, after passing the cooler 20, be displaced through a vacuum sluice 21 before it is being coiled on to a coiler 22.

EXAMPLE 2

An alternative process embodiment will now be described in connection with the flow chart shown in FIG. 4. Firstly, a band of a ferritic Cr-steel with rare earth additives is fabricated to a band thickness of 2–2.8 mm after which it is rolled to an intermediate thickness of 0.1–0.3 mm. The band is then provided with a coating of evaporated aluminum in the chamber 18 at a thickness of 10–30 $\mu$m. The material is then fed into the chamber 19 to be heat treated at 950–1150° C. in the same line or in a subsequent process step. It is preferable to make the heat treatment in a separate process step after the PVD-coating due to the fact that the thicker band thickness will require longer annealing times. The heat treatment will replace the ordinary recrystallization anneal that is carried out before cold rolling to final dimension. After having deposited the aluminum on to the steel band and carried out homogenization of the ferritic Cr-steel, it is made subject to cold rolling to the final dimension, 30–50 $\mu$m.

According to a further alternative process embodiment, the homogenization for obtaining diffusion of Al into the steel band can be carried out after the material is rolled to its final dimension. The heat treatment can also be carried out in connection with the fabrication of the catalytic converter.

Thanks to the new fabrication method according to the invention, it becomes possible to use an installation in which the Al-deposition of the band is made continuously at high speeds. Compared with other methods, as related before, this new fabrication method becomes price competitive. The rapid coating speed is possible by using available advanced vacuum systems which are available in combination with more tight sluices. Another advantage with this PVD-method compared with other methods is that it is possible to control the coating thickness evenly along the band with high precision.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of manufacturing high-temperature resistant ferritic Cr-steel bands, including fabricating a FeCr-steel with rare earth metal additives, rolling said steel into a band in several steps with intermediate recrystallization anneals between said rolling steps, feeding the band into a coating chamber and depositing an aluminum coating on the band by a physical vapor deposition technique, heat treating said band at a temperature of 950–1150° C. for a time sufficient to obtain homogenization and diffusion of the aluminum into said steel band, and cold rolling the band to achieve its desired final dimension.

2. The method of claim 1 wherein the band is subjected to a straightening directly after the heat treatment at 950–1150° C.

3. The method of claim 1 wherein the band is coated with Al in the chamber for a time sufficient to obtain a coating of 3–10 $\mu$m pure Al on each side of the band.

4. The method of claim 3 wherein the heat treatment at the temperature of 950–1150° C. occurs during a time of about 20 seconds.

5. The method of claim 1 wherein the band before physical vapor deposition is passed through a zone where the band is washed in de-ionized water and the band is hot straightened directly after the heat treatment has been completed.

6. A method of manufacturing high-temperature resistant ferritic Cr-steel bands, including fabricating a FeCr-steel with rare earth metal additives, rolling said steel into a band in several steps with intermediate recrystallization anneals between said rolling steps, feeding the band into a coating chamber and depositing a coating of 3–10 μm Al on each side of the band by a physical vapor deposition technique, and heat treating said band at a temperature of 950–1150° C. for a time sufficient to obtain homogenization and diffusion of the aluminum into said steel band.

7. The method of claim 6 wherein the coating is pure Al.

8. The method of claim 6 wherein the band is cold rolled to its desired final dimension subsequent to the heat treating.

9. The method of claim 8 wherein the band after cold rolling to its final dimension is subjected to a final recrystallization anneal.

* * * * *